(12) United States Patent
Kam et al.

(10) Patent No.: US 8,576,560 B1
(45) Date of Patent: Nov. 5, 2013

(54) LINE MEMORY MODULE FORM FACTOR COOLING DEVICE

(75) Inventors: Pascal C. Kam, Union City, CA (US); Greg Imwalle, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 131 days.

(21) Appl. No.: 13/223,389

(22) Filed: Sep. 1, 2011

Related U.S. Application Data

(62) Division of application No. 12/392,610, filed on Feb. 25, 2009, now Pat. No. 8,050,029.

(51) Int. Cl.
*H05K 7/20* (2006.01)
*G06F 1/20* (2006.01)

(52) U.S. Cl.
USPC ............ 361/679.49; 361/679.48; 361/679.51; 361/694; 361/695; 361/715; 312/236; 720/649

(58) Field of Classification Search
USPC ............. 361/679.33, 679.34, 679.46–679.51, 361/690–697, 715–727; 165/80.3, 104.33, 165/121–126, 185; 174/15.1, 16.3, 252; 713/299, 300; 720/649; 312/223.2, 312/223.3; 454/184
See application file for complete search history.

(56) References Cited

U.S. PATENT DOCUMENTS

| | | | |
|---|---|---|---|
| 5,079,438 A * | 1/1992 | Heung | 307/141 |
| 5,171,183 A | 12/1992 | Pollard et al. | |
| 5,734,551 A * | 3/1998 | Hileman et al. | 361/695 |
| 6,183,214 B1 | 2/2001 | Ko | |
| 6,388,878 B1 | 5/2002 | Chang | |
| 6,473,297 B1 | 10/2002 | Behl et al. | |
| 6,628,518 B2 | 9/2003 | Behl et al. | |
| 6,654,894 B2 | 11/2003 | Kaminski et al. | |
| 6,840,801 B1 | 1/2005 | Behl | |
| 6,982,872 B2 | 1/2006 | Behl et al. | |
| 7,061,760 B2 * | 6/2006 | Hornung et al. | 361/695 |
| 7,150,644 B2 | 12/2006 | Behl | |
| 7,206,201 B2 | 4/2007 | Behl et al. | |
| 7,420,801 B2 | 9/2008 | Behl | |
| 7,436,663 B2 * | 10/2008 | Matsushima et al. | 361/695 |
| 7,471,514 B2 * | 12/2008 | Chen | 361/695 |
| 7,480,147 B2 * | 1/2009 | Hoss et al. | 361/721 |
| 7,580,259 B2 | 8/2009 | Hsiao | |

(Continued)

OTHER PUBLICATIONS

FrozenCPU.com, Bay Coolers, http://www.frozencpu.com/cat/12/g34/c147/list/p1/Bay_Devices-Bay_Coolers.html?o+rati. . . . , downloaded Feb. 25, 2009, 4 pages.

(Continued)

*Primary Examiner* — Michail V Datskovskiy
(74) *Attorney, Agent, or Firm* — Lerner, David, Littenberg, Krumholz & Mentlik, LLP

(57) ABSTRACT

Aspects of the invention include a method and apparatus for cooling a hard drive in a hard drive array. In one example, the cooling device has similar dimensions as a hard drive on a server. Within the cooling device is a fan. The positioning of the fan provides both impingement and indirect airflow on a hard drive. The cooling device may also have power and data connections identical to those of the hard drive. These connections allow the cooling device to be connected and controlled by a control unit. The control unit may operate to monitor and control the temperature of the hard drive by controlling the power and speed of the fan. In another example, the cooling device is operable to cool DIMMs on a circuit board.

17 Claims, 12 Drawing Sheets

(56) References Cited

U.S. PATENT DOCUMENTS

| | | | | |
|---|---|---|---|---|
| 7,821,788 | B2 | 10/2010 | Hsiao | |
| 7,852,624 | B2 | 12/2010 | Sun | |
| 7,969,736 | B1 * | 6/2011 | Iyengar et al. | 361/699 |
| 8,064,199 | B2 * | 11/2011 | Lin | 361/695 |
| 8,385,069 | B2 * | 2/2013 | Iyengar et al. | 361/700 |
| 2007/0000649 | A1 * | 1/2007 | Peng | 165/121 |
| 2007/0064385 | A1 | 3/2007 | Paul et al. | |
| 2009/0154092 | A1 | 6/2009 | Chen | |
| 2011/0290894 | A1 * | 12/2011 | Dufresne et al. | 236/49.3 |

OTHER PUBLICATIONS

Hard Drive Coolers, Fans and Heatsinks, http://www.xpcgear.com/hdcoolers.html, downloaded Feb. 25, 2009, 2 pages.

Hard Drive Fans and HD Coolers at Xoxide.com-Hard Drive Coolers, http://www.xoxide.com/hardrivcooll.html, downloaded Feb. 25, 2009, 3 pages.

Katz, Randy H, Tech Titans Building Boom, IEEE Spectrum, Feb. 2009, pp. 40-54.

KDE1204PKV2 SUNON SUNON_DC Axial Fan, http://us.100y.com.tw/PNoInfo/44153.htm, downloaded Feb. 25, 2009, 2 pages.

Scythe Kama Bay 5.25" System Cooler-Silver, http://www.xoxide.com/scythe-kama-bay-cooler-silver.html, downloaded Dec. 20, 2008, 5 pages.

Scythe Support Kama-Bay Installation Guide, http://www.scythe-usa.com/support/support_temp/003/sckb1000_install3.html, downloaded Dec. 30, 2008, 4 pages.

Seagate, Barracuda 7200.9 Serial ATA Prodcuct Manual, Aug. 2007, 44 pages.

* cited by examiner

EXPERIMENTAL DATA

| Hard Drive Receptacle Number | Hard Drive or Cooling Device | Change in Temperature* |
|---|---|---|
| 1 | HD | 8 |
| 2 | HD | 5 |
| 3 | HD | 14 |
| 4 | Cooling Device | N/A |
| 5 | HD | 11 |
| 6 | HD | 2 |
| 7 | HD | 0 |
| 8 | HD | 1 |
| 9 | HD | 6 |
| 10 | Cooling Device | N/A |
| 11 | HD | 11 |
| 12 | HD | 2 |

*Change in Temperature = Temperature Measured without Cooling Apparatus – Temperature Measured with the Cooling Apparatus All in degrees Celsius.

FIGURE 7

LINE MEMORY MODULE FORM FACTOR COOLING DEVICE

CROSS-REFERENCE TO RELATED APPLICATIONS

This application is a divisional of U.S. application Ser. No. 12/392,610, filed on Feb. 25, 2009, the disclosure of which is incorporated herein by reference.

FIELD OF THE INVENTION

Aspects of the invention relate generally to methods and apparatuses for cooling devices in a server structure. More specifically, aspects of the invention involve a cooling device with a similar form factor as a heat producing device, for example a hard drive in a server array.

DESCRIPTION OF RELATED ART

Large-scale computing systems, such as server farms, may have one or more servers, each of which may include multiple hard drives. When operating a large number of hard drives in a server, a primary goal is to draw as much heat as possible away from the hard drives and out of the server chassis. The resultant hot exhaust air may be run though a heat exchanger within a cooling system to continuously cool the server and its environment. For example, the server may be operating in a datacenter where the exhaust air from the server is used in the cooling system for the entire data center. The higher the exhaust temperature leaving the server, the more efficiently the datacenter cooling system may operate.

Hard drives generate heat during operation. If the temperature of a given hard drive becomes too hot, that hard drive may fail or its efficiency may degrade. Therefore, without proper cooling, some or all of the drives may become too hot to operate before the exhaust reaches a desired temperature.

To maintain optimal exhaust and operational temperatures, continuous airflow through the server structure may be provided. Traditionally, operators have addressed this problem by reducing the density of the hard drives on the server. As a result, the server structure may require a greater amount of physical space as opposed to a more compact arrangement. If a hard drive begins to overheat or fails, it is typically removed for maintenance.

Known cooling products include fans positioned near the heat producing device. For example, some products require that the fan be mounted directly to a hard drive. Certain cooling products require separate power connections within the computer. Furthermore, fans used to cool the drives may cause vibrations which can degrade the performance of the drives.

BRIEF SUMMARY OF THE INVENTION

Aspects of the invention provide targeted cooling to multi-drive computing architectures. In accordance with one embodiment of the invention, an apparatus for cooling hard drives in a hard drive array is provided. Each hard drive has a predetermined form factor for fitting into a respective hard drive receptacle, and the hard drives have data and power connections. The apparatus comprises a housing so dimensioned as to be received into one of the hard drive receptacles in the array. The apparatus further comprises a fan affixed to the housing to cool a selected hard drive on the array, wherein the fan causes both impingement as well as indirect airflow on a surface of the selected hard drive at a predetermined non-zero angle relative to the surface to direct airflow away from a first end of the hard drive array and towards a second end of the hard drive array.

In one alternative, the housing also comprises an angled duct to promote continuous airflow towards the second end of the server.

In another alternative, the housing comprises rails adapted to be received in the receptacle, wherein the rails being configured to dampen vibrations caused by operation of the fan.

In yet another alternative, apparatus further comprises a power connection and a data connection for sending or receiving information. The power connection and the data connection are coupled to a processor operable to monitor the apparatus. The processor may also be operable to vary the fan speed by varying the power to the fan and may be connected to the selected hard drive by a second data connection for sending or receiving information, and the second data connection is of the same type as the first data connection.

In still another alternative, the apparatus includes a temperature sensing device for sensing a temperature of the surface of the selected hard drive.

In an additional alternative, the apparatus is removable from the receptacle without disturbing operation of the selected hard drive.

In another alternative, the fan may be mounted within the housing at an angle between about 15 degrees and 45 degrees below a line parallel to a surface of the selected drive.

In a further alternative, the apparatus may comprise a duct with a first end, the first end of the duct being less than 5 millimeters below the surface of the selected drive to direct the airflow towards the second end of the hard drive array.

In accordance with another embodiment of the invention, a method of cooling a first hard drive in a hard drive array includes removing a second hard drive. The second hard drive has a predetermined form factor for fitting into a hard drive receptacle and also has data and power connections. The method also includes inserting a cooling apparatus, wherein the cooling apparatus has a housing so dimensioned as to be received into the hard drive receptacle so that the cooling apparatus is positioned above or below the first hard drive.

In one alternative, the method may include monitoring the temperature of the first hard drive. In this example, the cooling apparatus has power and data connections to connect to a processor, and the processor is operable to monitor the cooling apparatus. The processor may be operable to monitor the temperature of the hard drive, may be operable to vary the power input to the fan, and may be operable to control the temperature of the hard drive.

In accordance with a further embodiment of the invention, a server operates to run one or more hard drive units. The server comprises a hard drive received into a first hard drive receptacle; a control unit including a processor for controlling the operation of the hard drive; and a cooling device for cooling the hard drive, wherein the cooling device is so dimensioned as to be received into a second hard drive receptacle, the cooling device containing a fan which causes both impingement and indirect airflow on the hard drive.

In one alternative, the processor may be operable to monitor the temperature of the hard drive. The processor may also be operable to vary the power input to the fan. The processor may be operable to control the temperature of the hard drive.

In accordance with a an additional embodiment of the invention, an apparatus for cooling one or more DIMMs on a circuit board where each DIMM having a predetermined form factor for fitting into a respective receptacle on the circuit board. The DIMMs have data and power connections. The apparatus comprises a housing so dimensioned as to be received into a selected one of the respective receptacles on the circuit board at an angle relative to the circuit board. The housing also comprises a fan affixed to the housing to cool a selected DIMM on the circuit board. The fan causes both impingement as well as indirect airflow on a surface of the selected DIMM at a predetermined non-zero angle relative to a surface of the selected DIMM. The fan directs airflow away from a first end of the circuit board and towards a second end of the circuit board.

In one alternative, the housing may also include an angled duct to promote continuous airflow towards the second end of circuit board.

In another alternative, the apparatus may also include a data connection for transmitting information. The data connection to and from the apparatus is coupled to a processor operable to monitor the selected DIMM. The processor may also be operable to vary speed of the fan by varying power to the fan. The processor may also be connected to the selected DIMM by another data connection for transmitting information, and both of the data connections are of the same type.

In a further alternative, the apparatus further comprises a temperature sensing device for sensing a temperature of the selected DIMM.

In still another alternative, the fan is mounted at an angle of between 30 and 45 degrees below a relative to a surface of the selected DIMM.

In yet another alternative, the apparatus comprises a duct with a first end. During operation, the first end is spaced at less than about 5 millimeters from the surface of the selected DIMM to direct airflow through the cooling device.

In an additional alternative, the housing comprises at least one dampening device adapted to be received in the selected receptacle, wherein the at least one damping device is configured to dampen vibrations caused by operation of the fan.

DESCRIPTION OF THE DRAWINGS

FIG. 7 provides a table of experimental data in accordance with the test bed of FIG. 4.

DETAILED DESCRIPTION

The aspects, features and advantages of the invention will be appreciated when considered with reference to the following description of preferred embodiments and accompanying figures. The following description does not limit the invention; rather, the scope of the invention is defined by the appended claims and equivalents.

Figure 1:
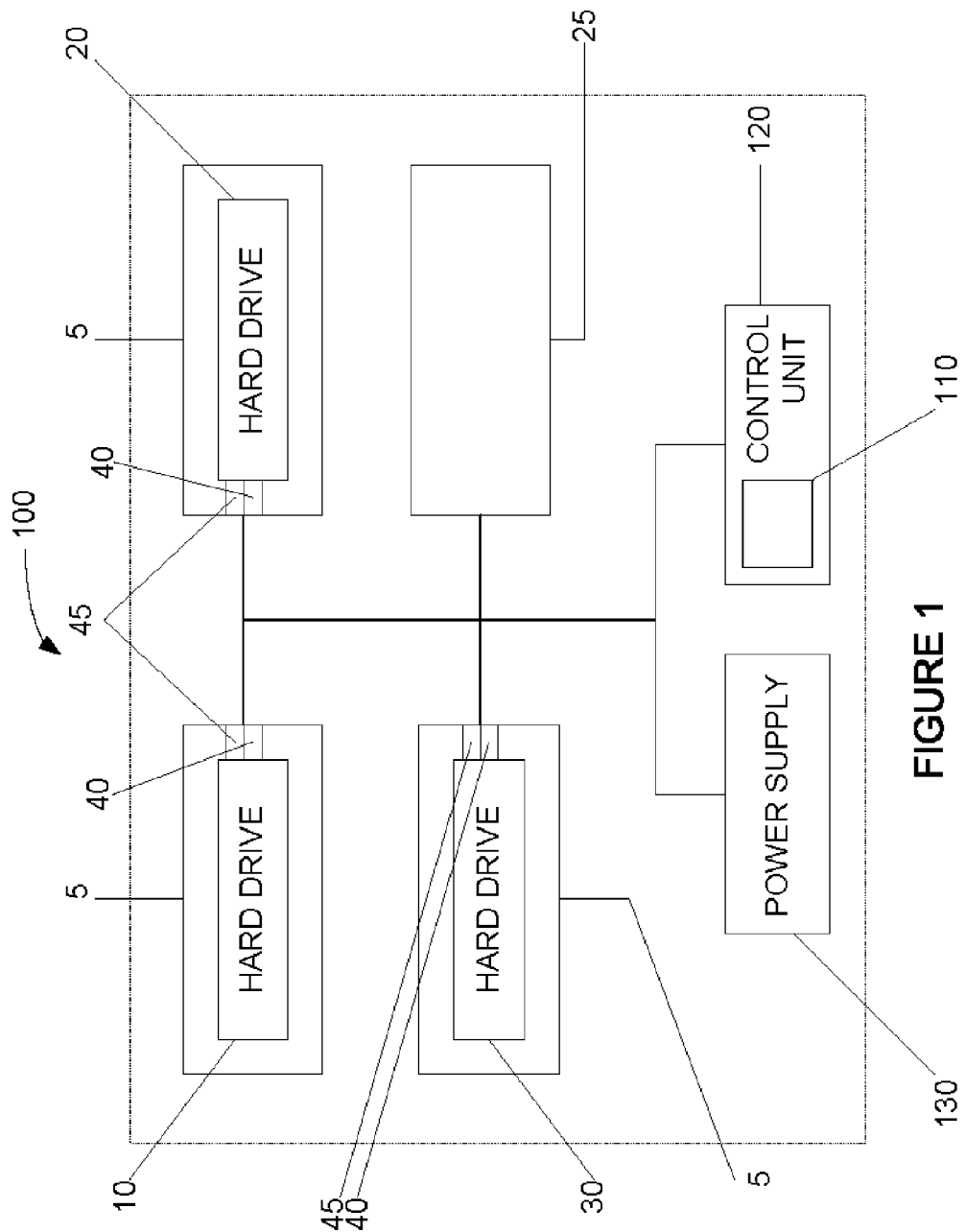
FIG. 1 illustrates an exemplary server configuration in accordance with one aspect of the invention.

As shown in FIG. 1, a system in accordance with one aspect of the invention comprises a server 100 containing multiple hard drives, such as hard drives 10, 20 and 30, connected to a control unit 120. Each hard drive may be mounted in a chassis.

The server may be comprised of one or more hard drives controlled by a processor 110 of the control unit. By way of example only, the server may be a web server. The server may be configured to communicate with other computing systems capable of processing instructions and transmitting data to and from humans and other computers, including network computers lacking local storage capability, PDA's with modems and Internet-capable wireless phones.

The hard drives on the server may be any commercially available hard drives. During operation (e.g., reading and writing of data), the hard drives generate heat. Different hard drive models may produce different amounts of heat and may have different maximum operating temperatures, for example, between 50° C. and 70° C. The temperature is desirably measured at or adjacent the surface of the hard drive. One may want to operate the hard drive as close to the maximum operating temperature as possible to both maximize the temperature of the hot air leaving the server structure, and, if coupled to a heat exchanger, to maximize the efficiency of the heat exchanger. The hard drives may not operate properly or at all if the temperatures exceeds the maximum operating temperature.

For example, one may use a hard drive such as the Seagate Barracuda 7200.9 Serial ATA on a server system. When operating the Barracuda, the product manual states that the actual temperature of the drive case should not exceed 69° C. Operation above this temperature may cause the hard drive to malfunction.

The hard drives are contained within a housing, or chassis. The chassis is configured to fit into an individual chassis receptacle 5 on the server. Reference number 25 depicts an empty chassis receptacle with no hard drive.

Different hard drive may have different chassis with different dimensions and/or volumes. For example, the Barracuda chassis is approximately 5.8 inches by 4.0 inches by 0.8 inches. The Barracuda chassis may fit into a receptacle which, for example, measures approximately 6.0 inches by 4.8 inches by 1.5 inches. The chassis receptacle may be larger or smaller depending on the attributes of the hard drive chassis. Other hard drives may have more than one chassis, where the outer most chassis may be configured to fit into a chassis receptacle.

The hard drives also have data inputs 40 and power inputs 45, or may have a single combination data and power input. The hard drives may be connected to the control unit 120 through their respective data inputs.

The processor 110 of control unit 120 desirably controls the operations of the hard drives on the server 100. The processor 110 may comprise any number of well known processors, such as processors from Intel Corporation. Alternatively, the processor may be a dedicated controller for executing operations, such as an ASIC. The processor may also comprise a collection of processors which may or may not operate in parallel. The processor 110 may be capable of monitoring the temperature of the hard drives and/or the overall temperature within the server.

Figure 2:
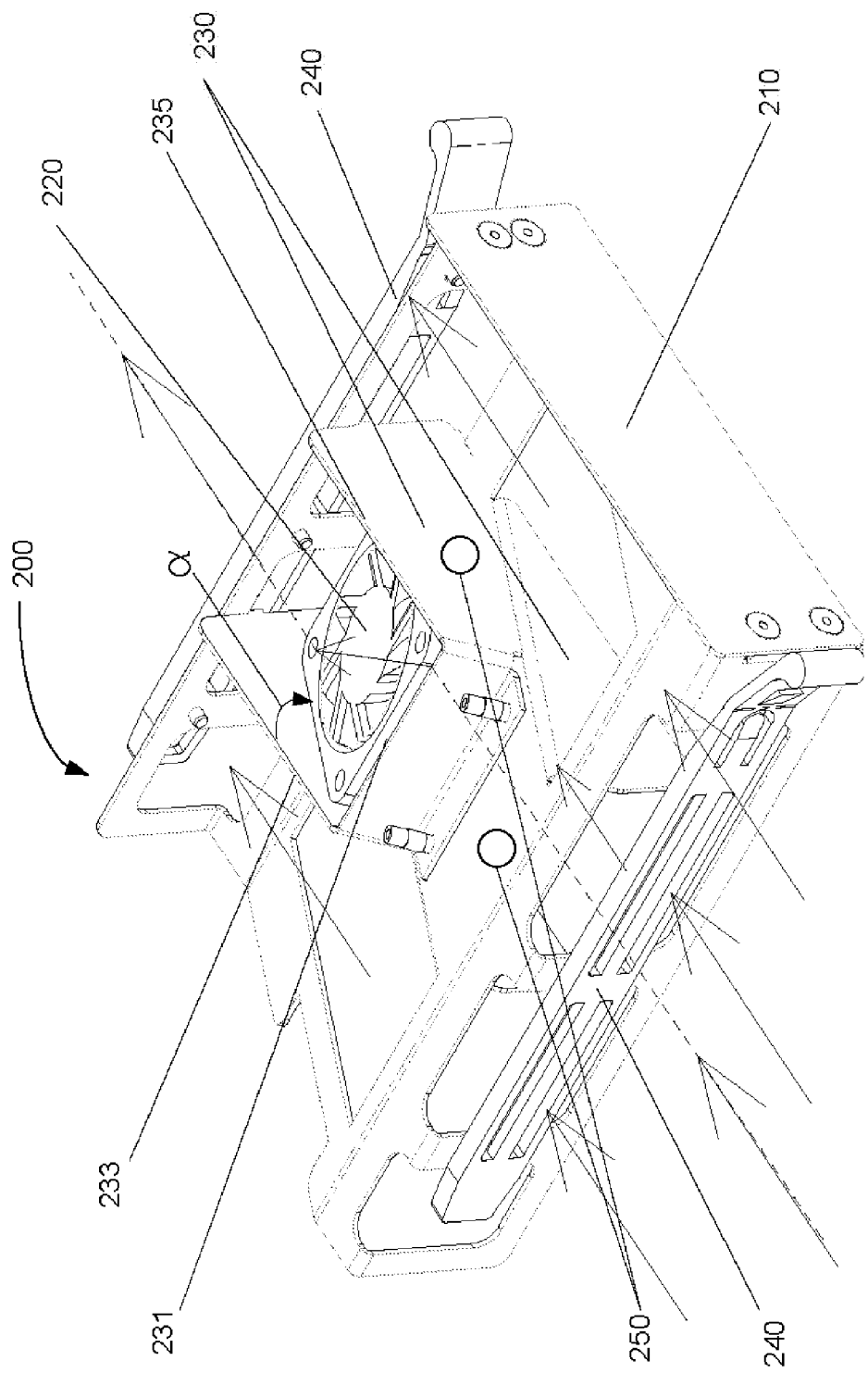
FIG. 2 illustrates a cooling device in accordance with one aspect of the invention.

FIG. 2 depicts a cooling device 200 in accordance with one aspect of the invention. The cooling device 200 is configured to fit into the chassis receptacles 5 on the server in lieu of a hard drive. As shown, the cooling device 200 includes a housing 210, which may have similar dimensions or an equivalent form factor as the hard drives 10, 20 or 30. Regardless of the specific dimensions of a given hard drive, the cooling device 100 should be dimensioned as to be received within and removably secured to the chassis receptacle. The cooling device may also include a fan 220, an air duct 230, and rails 240.

The cooling device 200 may be used to replace any hard drive on the serve or placed in a vacant chassis receptacle. The cooling device may be positioned above or below a selected drive to allow both impingement, or direct cooling, as well as indirect cooling of the overheating drive.

Figure 3:
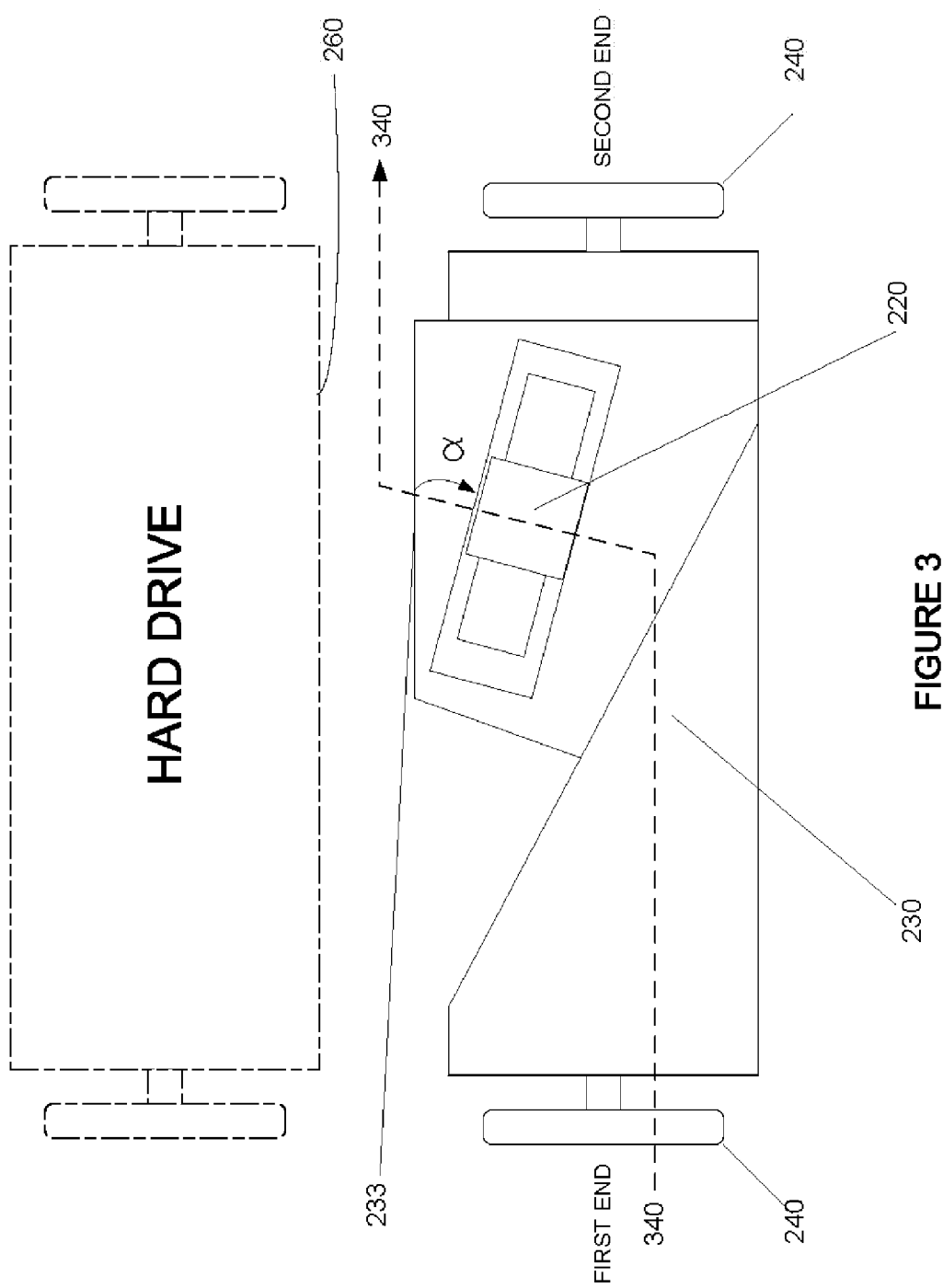
FIG. 3 illustrates a cutaway side view of the cooling device in accordance with one aspect of the invention.

As shown in FIGS. 2 and 3 a fan 220 is mounted within the housing. The fan may be any model available so long as the dimensions are suitable to fit within the housing. For example, Sunon model number KDE1204PKV2 may be used. This Sunon fan measures approximately 1.6 inches in width by 1.6 in length inches by 0.79 inches in depth. The fan may be mounted at an angle $\alpha$, relative to a surface of a hard drive to be cooled. As shown in FIG. 3, the fan is at the angle $\alpha$ relative to surface 260, such as a bottom surface of the hard drive of interest. The angle $\alpha$ may be for example, on the order of 15 to 45 degrees. Alternatively, the angle $\alpha$ may be approximately 30 degrees to promote airflow both on and around the drive. The fan may be affixed to a duct 230 of the housing 210. Although not shown, multiple fans may be used within the cooling device to provide cooling. Multiple fans may allow for more intricate control over the cooling power of the device and may allow for more targeted cooling directed towards specific "hot spots" on a hard drive.

The duct 230 is desirably angled in an "s"-shaped configuration to facilitate both impingement and indirect airflow on the drive. The "S" shape of the path of the air creates an airflow pattern moving generally from a direction of a first end 300, through the air duct, and towards a second end of the cooling device. While an "s"-shape configuration is shown, other shapes may be used which also avoid recirculation of the hot air around the hard drive or within the server. The air then continues through the remainder of the server and exits out the second end of the server as will be discussed in more detail below.

Figure 4:
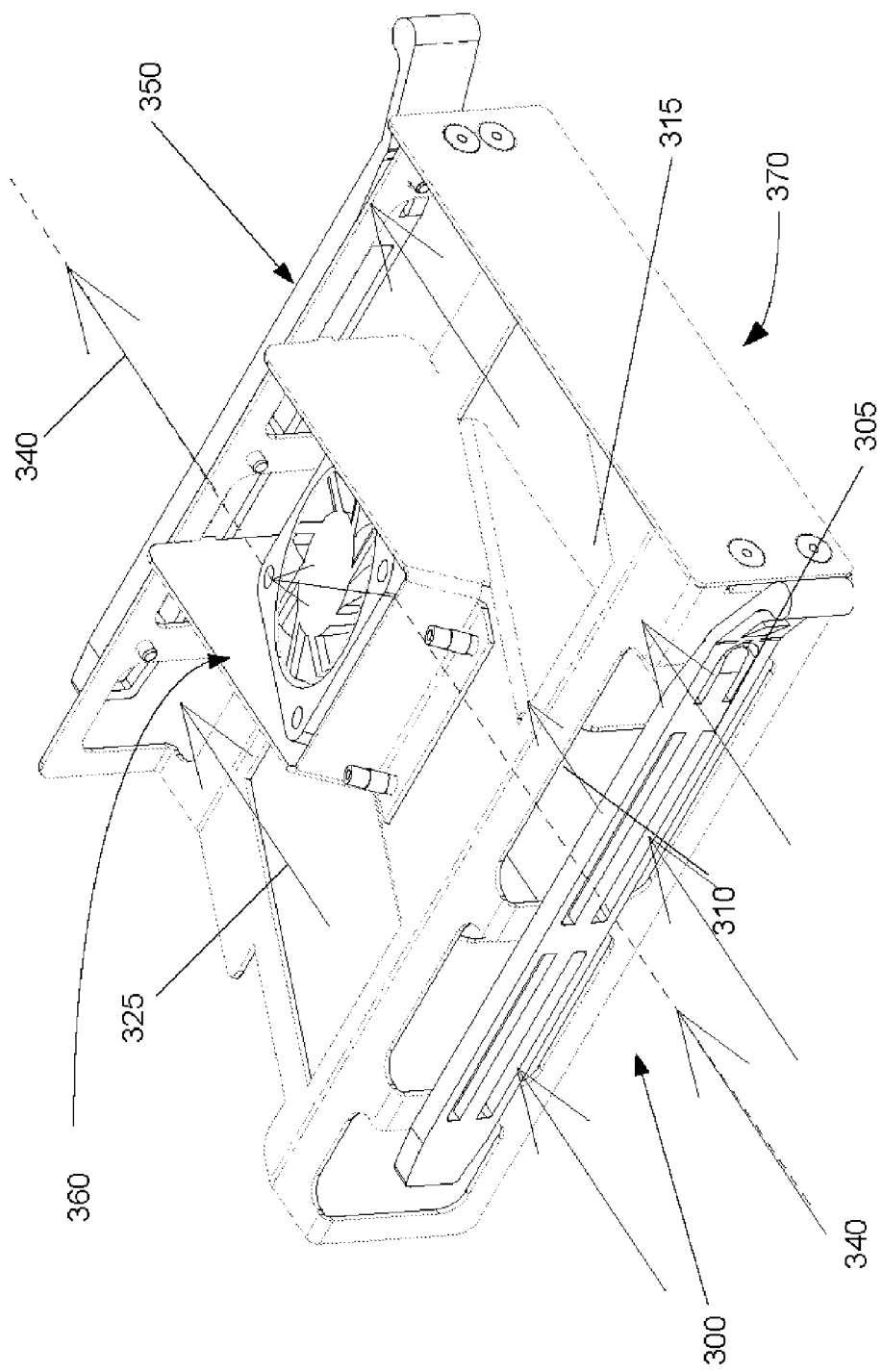
FIG. 4 is an airflow diagram in accordance with one aspect of the invention.

FIG. 4 demonstrates the airflow path around and through the cooling device 200 in one exemplary configuration. In this example, air enters from the first end 300 of the cooling device and may flow through the cooling device via various paths to the second end 350. Air may flow through a first section of the duct 230, for example a lower section, and be pulled towards a second end of the duct, for example an upper section, by the force of the fan 220 and forced along path 340 out the second end 350 of the device. Air may also flow along paths 315 and 325 adjacent to the fan and duct, through the cooling device, and out the second end 350 of the device. The open design of the cooling device allows for better airflow through the device and across the exposed, heated surface of the hard drive. It also promotes cooling of other drives by the directed airflow.

The walls 231, 233, and 235 of duct 230 extend towards the top 360 of the cooling device. High walls prevent the air from flowing back towards the first end 300 of the cooling device 200. For example, if the cooling device is located directly below a hard drive on a server, the top of the duct walls may be spaced on the order of a few centimeters or less, more preferably, less than 5 millimeters below the hard drive. Similar construction may be used if the cooling device is located above the hard drive or in any other location. In such a case, the design of the device may or may not be inverted. The small space between the top of the cooling device and the surface to be cooled constrains the airflow, creating grater control over the direction of the airflow, and for example, forcing the air along path 340. The smaller the space between the duct wall and the hard drive, the less hot air may flow back towards the a first end 300 of the cooling device 200.

Returning to FIG. 2, it can be seen that the housing 210 may be equipped with rails 240. The rails allow the cooling device to slide within a given one of the receptacles 5. The rails may also reduce vibrations from the fan and therefore may reduce any degradation effect the vibrations may have on the hard drives' efficiency. Furthermore, vibrations may also be reduced by not mounting the cooling device to the hard drive.

Figure 1A:
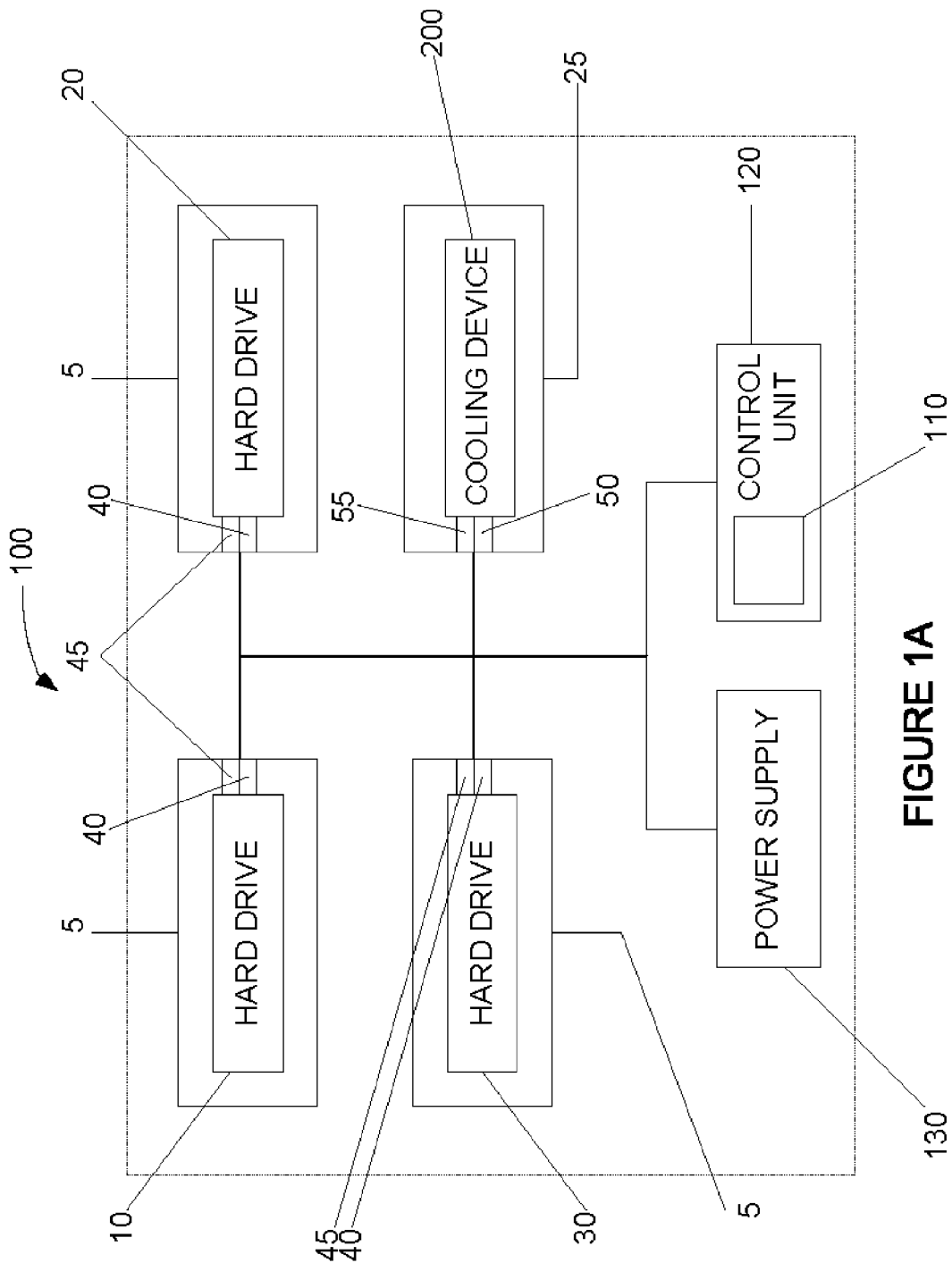
FIG. 1A illustrates an exemplary server configuration in accordance with one aspect of the invention.

As shown in FIG. 1A, the housing 210 also may include data input 50 and power input 55, the same power and/or data connections as the hard drives 10, 20, or 30. This allows the cooling device 200 to use the same power source as the hard drives as well as be connected to control unit 120.

The connection between cooling device 200 and control unit 120 allows the processor 110 to monitor the temperature of the cooling device 200. For example, one or more temperature sensing devices 250, for example a thermometer, may comprise part of the cooling device 200. Through this connection, the processor 110 may also control the cooling device 200, for example turning the cooling device on or off depending on the needs of the system. The processor may also control the speed of the fan within the cooling device by increasing, decreasing or pulsing the power supplied to the cooling device.

By monitoring and directly cooling those drives which are becoming too hot, operators may manage the flow of heated air out of the hard drive array and may increase the density of hard drives on the server. There is a great benefit in having a large number of drives densely packed on the server with a few drives replaced by the cooling device, as compared to a lower density of drives to promote airflow. The overall effect is to increase efficiency and reduce operating costs.

Figure 5:
FIG. 5 illustrates an offset side view of a server test bed in accordance with an aspect of the invention.
Figure 6:
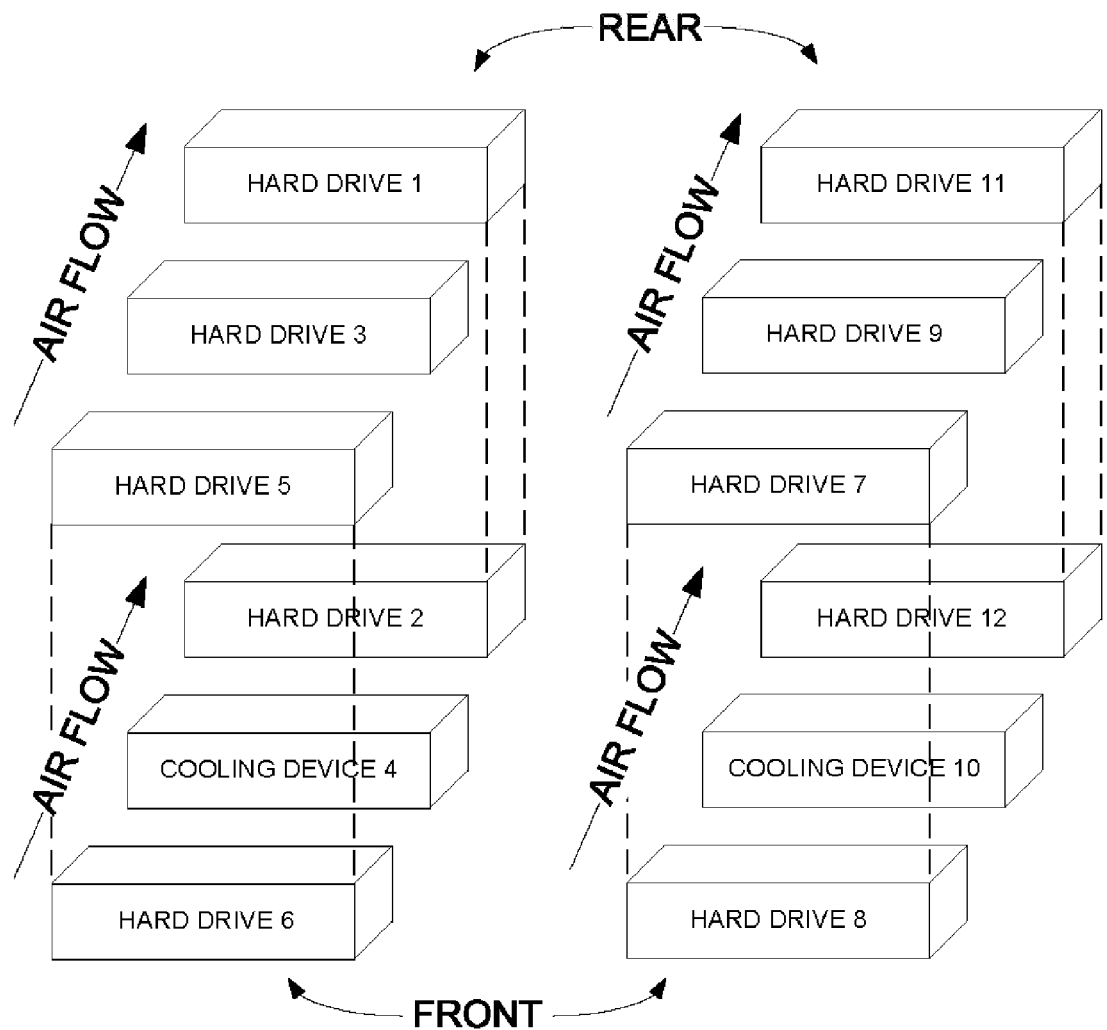
FIG. 6 illustrates an offset front view of a server test bed in accordance with an aspect of the invention.

FIGS. 5 and 6 illustrate an exemplary hard drive configuration used in a test bed. FIG. 7 is a table of experimental data obtained from the test bed demonstrating improved cooling by replacing two hard drives on an experimental server with cooling devices. The server was comprised of twelve hard drive chassis receptacles each containing a hard drive. The configuration of the hard drives used during the experimental trial is depicted in FIGS. 5 and 6. The numbers refer to the chassis receptacle number and the words hard drive and cooling device refer to the apparatus contained within that particular chassis receptacle during one phase of the experimental trial.

As shown in FIGS. 5 and 6, the test bed included 12 hard drive chassis receptacles. The odd numbered chassis receptacles were positioned above the even numbered chassis receptacles. For instance, receptacle 7 was directly above receptacle 8. And receptacle 1 was directly above receptacle 2. Receptacles 5, 6, 7 and 8 were located at the front end of the test bed, and receptacles 1, 2, 11, and 12 were located at the rear end of the test bed. Viewing the test bed from the front, receptacles 1 through 6 were on the left side of the test bed, while receptacles 7 through 12 were on the right side of the test bed. During the experimental trial, the cooling devices forced the air to flow the front of the server to the rear of the server.

In the first phase of testing, 12 hard drives were run for one hour, including hard drives in receptacles 4 and 10. Every minute for one hour, temperature measurements were taken. The last five measurements taken at each hard drive were averaged to obtain a first steady state average drive temperature for each respective hard drive. The server was then shut-down.

After 24 hours, a second phase of testing was begun. First, two hard drives were replaced with experimental cooling devices in chassis receptacles 4 and 10 as shown in FIGS. 4 and 5. Next the ten hard drives and the two experimental cooling devices were run. As with the first phase, temperature measurements were taken every minute. The last five temperature measurements were averaged to obtain a second steady state average drive temperature.

The difference in steady state temperature for each hard drive from the phase 1 test configuration to the phase 2 test configuration is calculated and tabulated in FIG. 7. This temperature difference represents the hard drives temperature change after the cooling apparatus is inserted into the system. The continuous airflow produced by the experimental cooling device had cooling effects on almost all of the 10 hard drives. For instance, the hard drives directly above chassis receptacles 4 and 10 (hard drives 3 and 9) experienced temperature decreases of 14° C. and 16° C. respectively. The hard drives in chassis receptacles 5, 6 and 8, experienced temperature decreases ranging from 1° C. to 11° C., despite being located closer to the front end of the test bed, behind the air flow generated by the fans of the cooling devices. The hard drives located above the cooling devices and towards the rear of the test bed, those in receptacles 1 and 11, experienced temperature decreases of 8° C. and 11° C. respectively. Thus, the testing shows that he cooling devices had cooling effects on hard drives other than those which were directly above the fans of the cooling devices. This demonstrates that the cooling device is effectively forcing the flow of hot air from the front end of the server and towards the rear end.

Figure 8:
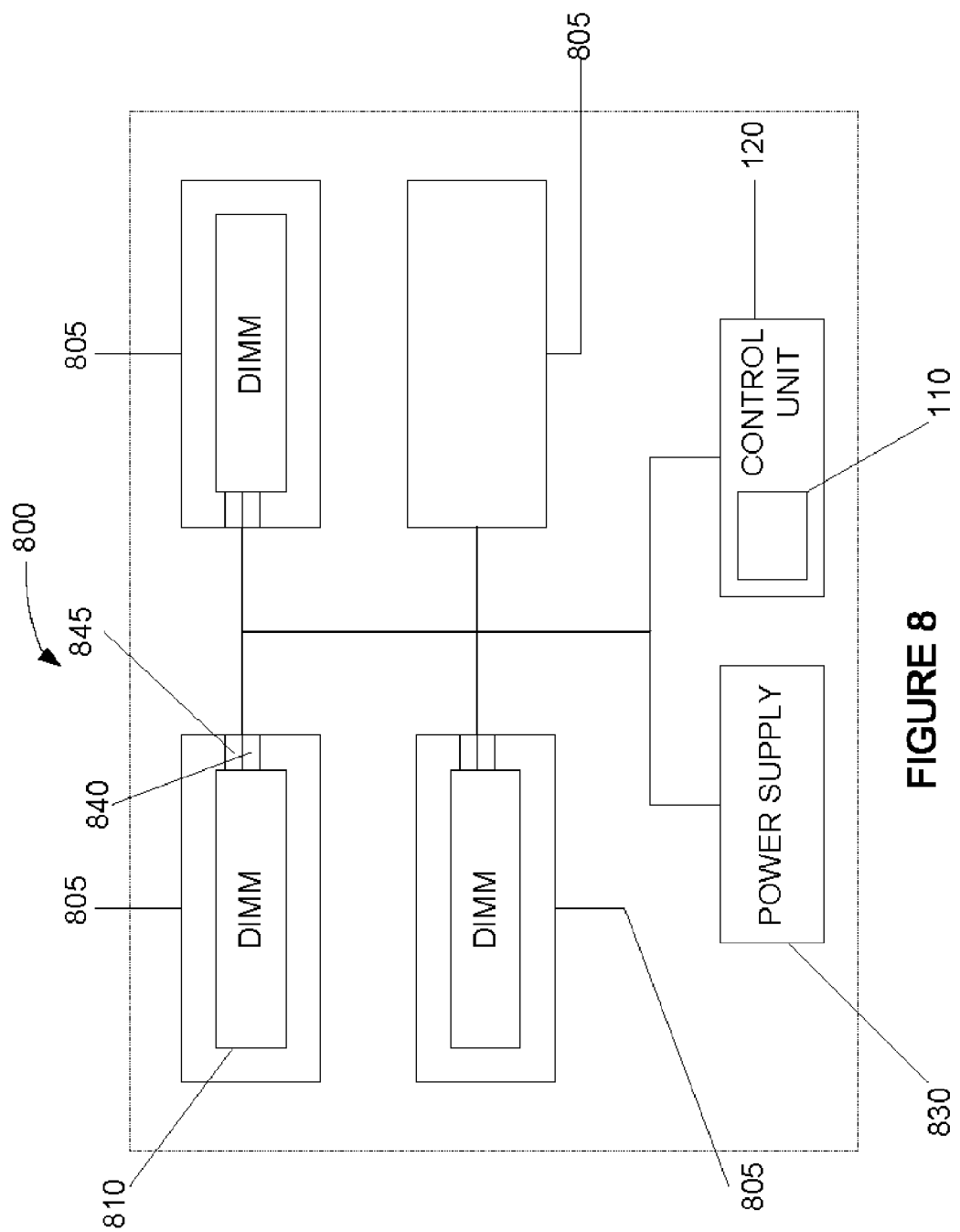
FIG. 8 illustrates an exemplary circuit board configuration in accordance with one aspect of the invention.
Figure 8A:
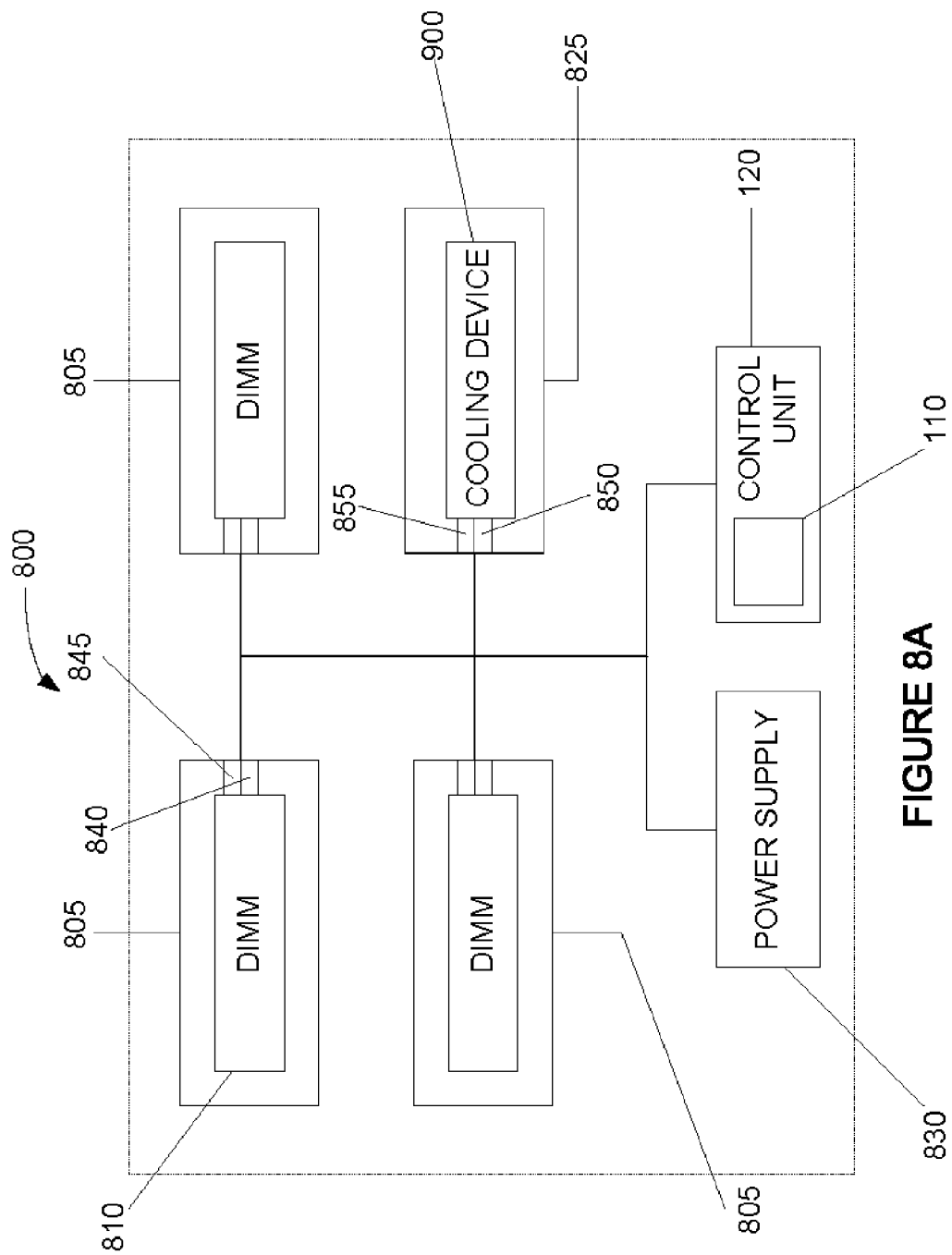
FIG. 8A illustrates an exemplary circuit board in accordance with one aspect of the invention.

In another aspect of the invention, the cooling device may be used to cool other memory devices, such as dual in-line memory modules ("DIMMs"). By way of example only, one or more DIMMs may be operating on a personal computer or in a server. As shown in FIGS. 8 and 8A, each DIMM 810 is inserted into a receptacle 805 on a circuit board 800 designed to receive the DIMM. The DIMMs have data connections 840 and power connections 845 that are connected to a control unit 120 which controls the operation of the DIMM.

Figure 9:
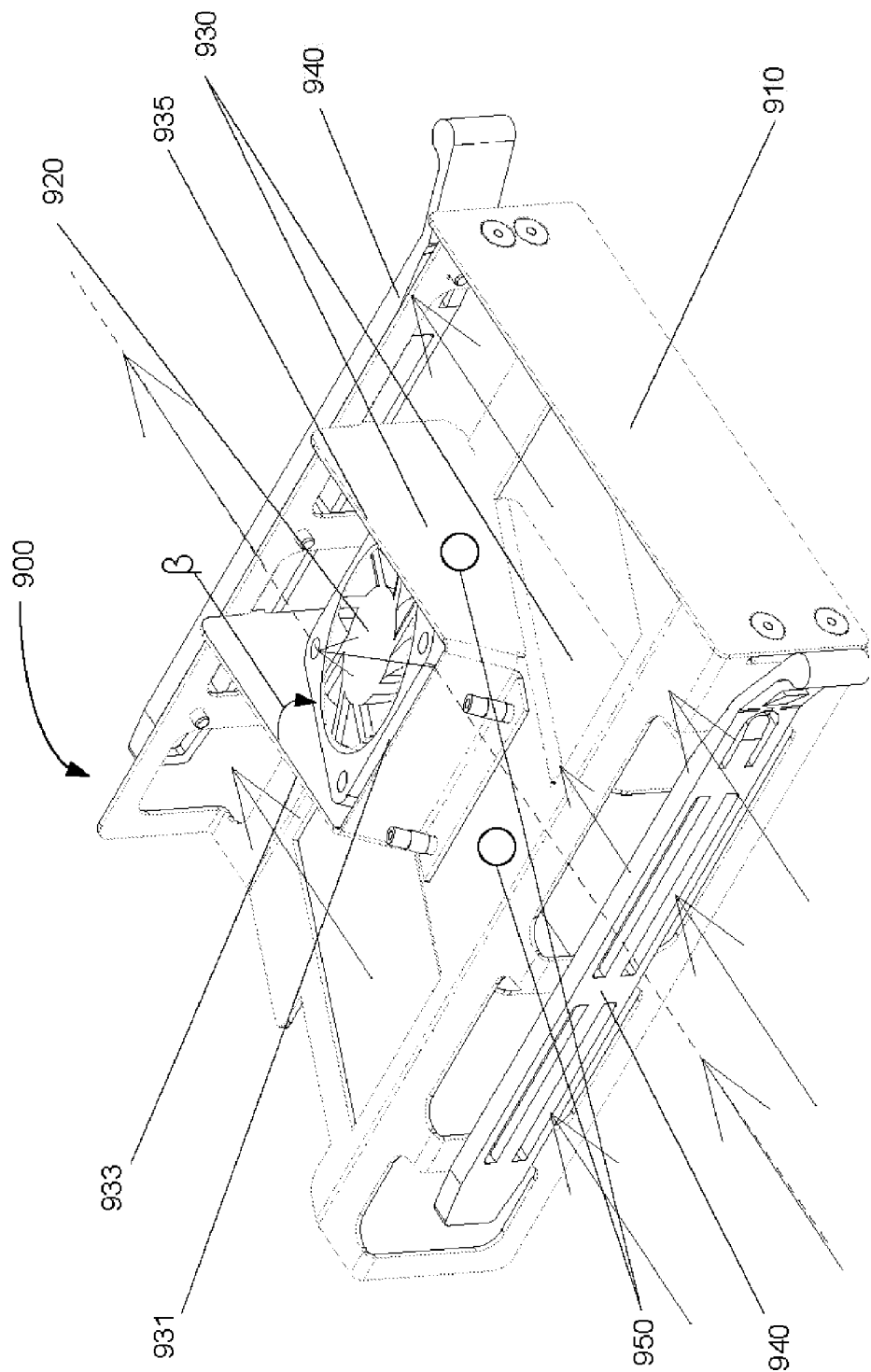
FIG. 9 illustrates a cooling device in accordance with one aspect of the invention.

The DIMM cooling device 900 of FIG. 9 operates in much the same way as the hard drive cooling device. However, the DIMM cooling device desirably has the same form factor as a DIMM module and is capable of replacing a DIMM to improve airflow and cool any surrounding DIMMs. The DIMM cooling device comprises a housing 910 containing a fan 920 and may also include one or more rails 940 or other dampening devices. Similar to the rails of the hard drive cooling device, the rails 940 of the DIMM cooling device may be included to reduce the vibrations caused by the fan. This reduction in the vibrations may also prevent degradation of the performance of a DIMM to be cooled. However, the rails/dampening devices of the DIMM cooling device are preferably smaller than the rails of the hard drive cooling device to fix the DIMM receptacle form factor.

As with the hard drive cooling device, the fan 920 of the DIMM cooling device is mounted at an angle within an air duct to provide both impingement and indirect airflow to cool the DIMMs. Some DIMMs may be inserted at an angle of 90 degrees to the circuit board or some other angle. Even if the angle is less than 90 degrees, it may be beneficial to place the fan within the DIMM cooling device on an angle relative to the DIMM(s), such as an angle β on the order of 15 to 48 degrees, preferably about 30 degrees, to promote both impingement and indirect airflow on the DIMMS.

Figure 10:
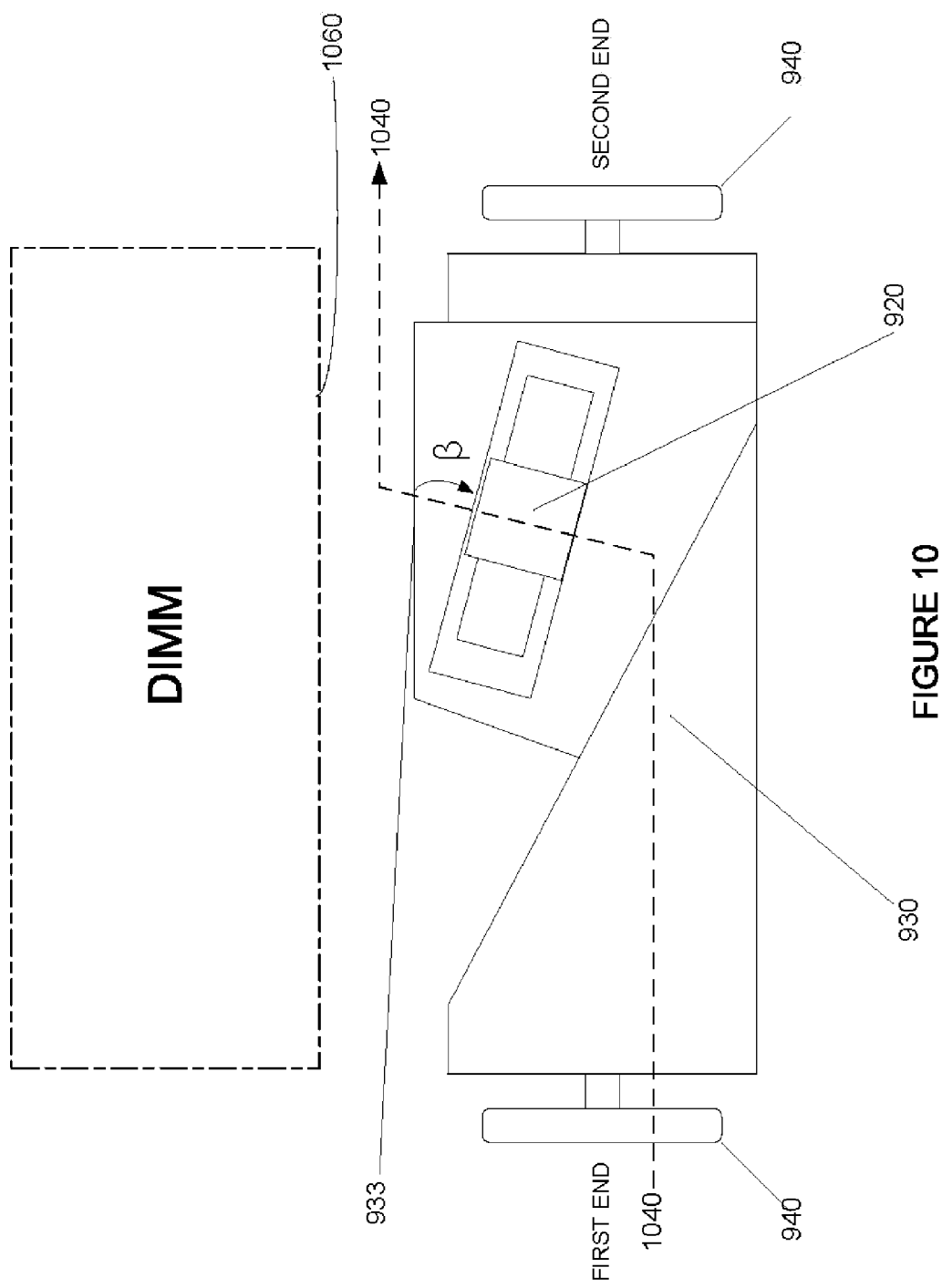
FIG. 10 illustrates a cutaway side view of the cooling device in accordance with one aspect of the invention.

The DIMM cooling device may also have a duct 930 which may have an "S" shape 1040 or other shape to allow the air to flow continuously through the personal computer or server. If the DIMM cooling device is situated directly below or above a DIMM, the side walls 931, 933 of the duct may extend towards surface 1060 of the DIMM of FIG. 10. This limits the amount of airflow escaping backwards from the DIMM cooling device.

The DIMM cooling device desirably includes power and data connections, 855, 850, the same as the DIMM. The DIMM may also be connected to a control unit 120 as described above. The control unit may be operated to monitor the temperature at temperature sensors 950 and control the operation of the DIMM cooling device.

The invention claimed is:

1. A method of cooling a first DIMM memory on a circuit board, the circuit board having a DIMM memory receptacle, the method comprising:
removing a second DIMM memory from the DIMM memory receptacle, the second DIMM memory having a predetermined form factor for fitting into the DIMM memory receptacle;
inserting a cooling apparatus having an angled duct and a fan mounted in the angled duct, wherein the cooling apparatus has a housing so dimensioned as to be received into the DIMM memory receptacle so that the cooling apparatus is positioned above or below the first DIMM memory, and when the cooling apparatus is inserted, the fan causes airflow through the angled duct in an s-shape pattern and the fan causes airflow on and away from a surface of the first DIMM memory.

2. The method of claim 1, further comprising monitoring the temperature of the first DIMM memory, wherein the cooling apparatus has power and data connections to connect to a processor, and wherein the processor is operable to monitor the cooling apparatus.

3. The method of claim 2, wherein the monitoring the temperature of the first DIMM memory is performed by the processor.

4. The method of claim 2, further comprising varying the power input to the fan by the processor.

5. The method of claim 2, further comprising controlling the temperature of the first DIMM memory by the processor.

6. A circuit board having one or more inline memory modules, the server having a first end and a second end, the server comprising:
an inline memory module received into a first hard drive receptacle;
a control unit including a processor for controlling the operation of the inline memory module; and
a cooling device for cooling the inline memory module, the cooling device having a housing so dimensioned as to be received into a second hard drive receptacle, the cooling device further having a fan mounted in an angled duct to promote continuous airflow in an s-shape pattern from the first end of the circuit board towards the second end of the circuit board, the fan causing airflow on and away from a surface of the inline memory module.

7. The circuit board of claim 6, wherein the processor is further operable to monitor the temperature of the inline memory module.

8. The circuit board of claim 7 wherein the processor is operable to vary the power input to the fan.

9. The circuit board of claim 8, wherein the processor is operable to control the temperature of the inline memory module.

10. An apparatus for cooling one or more inline memory module on a circuit board, the circuit board having a first end, a second end, and a plurality of receptacles, each inline memory module having a predetermined form factor for fitting into a respective receptacle on the circuit board, the apparatus comprising:
- a housing so dimensioned as to be received into a given one of the plurality of receptacles of the circuit board, the housing further having an angled duct to promote continuous airflow in an s-shape pattern from a first end of the circuit board towards the second end of the circuit board; and
- a fan affixed to the housing to cool a selected inline memory module on the circuit board, wherein the fan causes airflow on and away from a surface of the selected inline memory module and to direct airflow away from the first end of the circuit board and towards the second end of the circuit board.

11. The apparatus of claim 10, further comprising a first data connection for transmitting information, wherein the first data connection to and from the apparatus is coupled to a processor operable to monitor the selected inline memory module.

12. The apparatus of claim 11, wherein the processor is operable to vary speed of the fan by varying power to the fan.

13. The apparatus of claim 11, wherein the processor is connected to the selected inline memory module by a second data connection for transmitting information, and both the first and the second data connections are of a same type.

14. The apparatus of claim 10, further comprising a temperature sensing device for sensing a temperature of the selected inline memory module.

15. The apparatus of claim 10, wherein the fan is mounted at an angle of between 30 and 45 degrees below a line parallel to a second surface of the selected inline memory module.

16. The apparatus of claim 10, further comprising a duct with a first end being spaced during operation at less than about 5 millimeters from the surface of the selected inline memory module to direct airflow through the cooling device.

17. The apparatus of claim 10, wherein the housing further comprises at least one dampening device adapted to be received in the selected receptacle, wherein the at least one damping device is configured to dampen vibrations caused by operation of the fan.

* * * * *